United States Patent [19]
Malaviya et al.

[11] 3,988,619
[45] Oct. 26, 1976

[54] RANDOM ACCESS SOLID-STATE IMAGE SENSOR WITH NON-DESTRUCTIVE READ-OUT

[75] Inventors: Shashi Dhar Malaviya, Fishkill; Madhukar B. Vora, Hopewell Junction; William T. Wilson, Poughkeepsie, all of N.Y.

[73] Assignee: International Business Machines Corporation, Armonk, N.Y.

[22] Filed: Dec. 27, 1974

[21] Appl. No.: 537,007

[52] U.S. Cl. .............................. 307/311; 250/211 J; 357/15; 357/22; 357/30; 357/50
[51] Int. Cl.² .................. H01L 31/10; H01L 27/14; H01L 29/80; H01L 29/48
[58] Field of Search .................. 357/22, 30, 50, 59, 357/15, 45; 307/311; 250/211 J

[56] References Cited
UNITED STATES PATENTS

| | | | |
|---|---|---|---|
| 3,648,125 | 3/1972 | Peltzer | 357/50 |
| 3,718,916 | 2/1973 | Wada et al. | 357/15 |
| 3,721,839 | 3/1973 | Shannon | 357/22 |
| 3,761,327 | 9/1973 | Harlow et al. | 357/59 |
| 3,767,984 | 10/1973 | Shinoda et al. | 357/15 |
| 3,887,936 | 6/1975 | Shannon et al. | 357/22 |
| 3,896,483 | 7/1975 | Whelan | 357/22 |
| 3,931,633 | 1/1976 | Shannon et al. | 357/22 |

*Primary Examiner*—William D. Larkins
*Attorney, Agent, or Firm*—Sughrue, Rothwell, Mion, Zinn & Macpeak

[57] ABSTRACT

A solid state analog image sensor is disclosed in which the video input to the sensor is stored as a charge on a floating gate in a cell. The cell itself consists of a single J-FET with Schottky barrier contact to the metal word line. All associated address and drive/sense circuits are located around the active cell area. By filling up the active area with only the J-FET's and relegating the rest of the circuitry to the peripheral, inactive region, high picture resolution is obtained.

12 Claims, 14 Drawing Figures

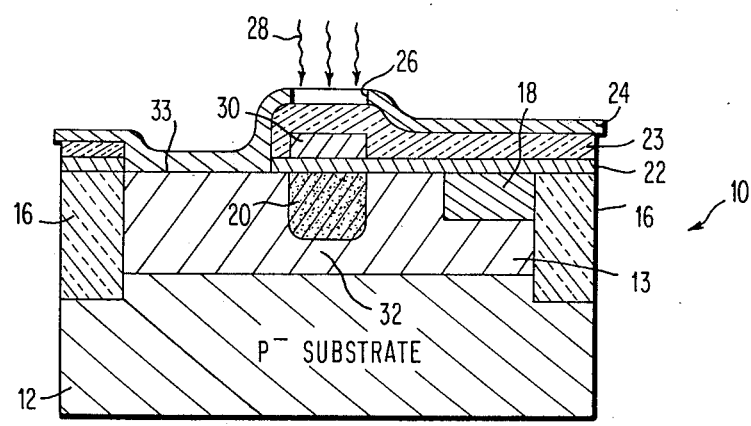
FIG.7
FIG.8
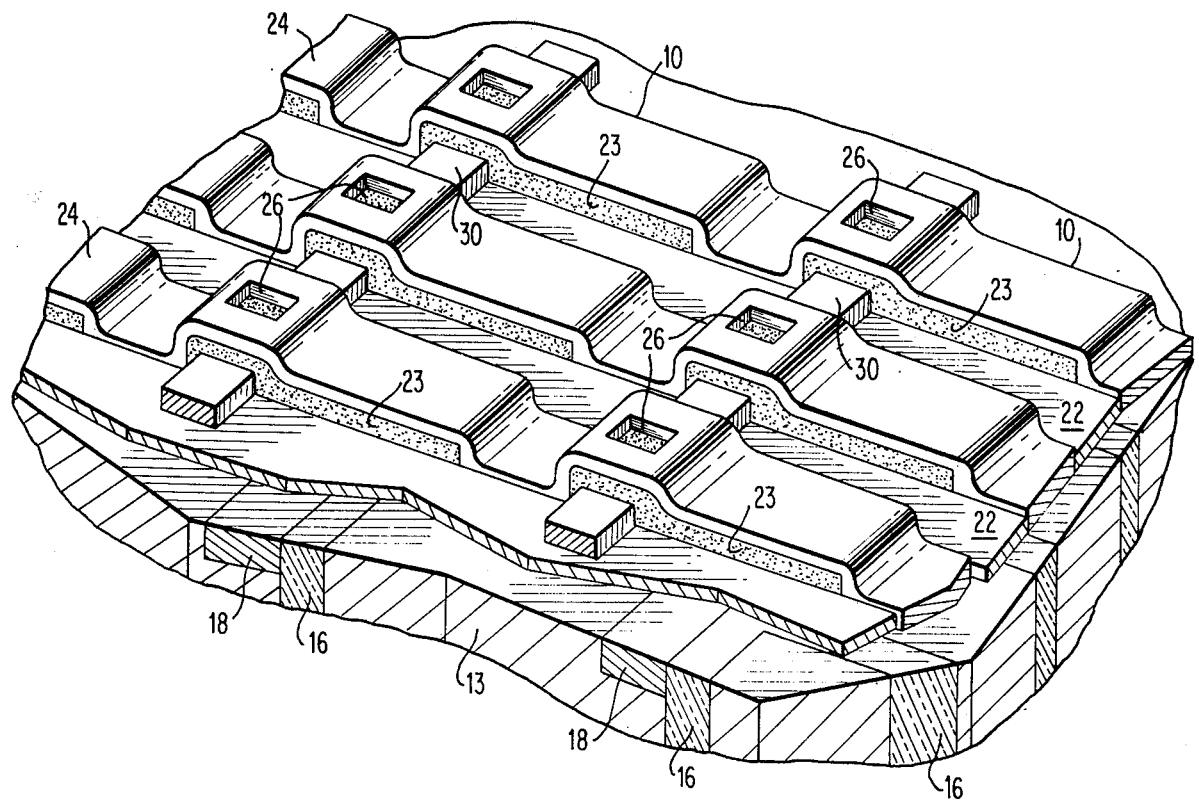

RANDOM ACCESS SOLID-STATE IMAGE SENSOR WITH NON-DESTRUCTIVE READ-OUT

BACKGROUND OF THE INVENTION

1. Field of the Invention

The invention relates to the field of solid state imaging devices utilizing diffused floating gates.

2. Prior Art

In the prior art, solid state imaging devices are well known and detailed. Vidicon tubes as imaging devices are perhaps best known and commercially acceptable because of the advantage of operation in the charge storage mode. In this device a charge is stored on each imaging element for the full time frame between the interrogating intervals and the output signal represents the stored charge remaining after the frame time interval. The application of this principle to solid state imaging devices has provided advantages of a similar nature but has not solved the low signal-to-noise level inherent in these devices.

An early summary of solid state imaging devices is found in IEEE Spectrum, March, 1969, pp. 52–65 and IEEE Transactions on Electron Devices, April, 1968, Vol. ED-15, No. 4, pp. 256–261. But, since all of the multi-element imaging systems disclosed include a multitude of internal capacitances coupled by way of a common substrate or by connections to the image element being interrogated, the output signal is accompanied by a high level of noise representing the capacitance coupled signals from the non-interrogated elements. The noise level stems from the capacitance coupled non-interrogated elements and occurs during switching from element to element, which coinciding with the signal, maintains the noise level high.

To overcome this problem, the prior art has tried a variety of techniques utilizing a number of photo-sensitive elements. Representative is the patent to Shannon, U.S. Pat. No. 3,721,839, which utilizes a junction field effect transistor (J-FET) with circular drain surrounded by a circular junction gate with the epitaxial layer serving as a common source for a line of elements. A pulse is applied to the gates to deplete the channel around the drains, and a non-destructive read-out is obtained by measuring the impedance between the drains and a common source. In Shannon, response is controlled by varying the epitaxial layer-substrate reverse bias as a function of depth of the depletion region. The gates in this patent are driven by other devices and are directly coupled by metal contacts. The number of metal contacts required is a disadvantage of prior art imaging devices such as shown in Shannon because making metal semiconductor contacts is done at the expense of image resolution. That is, space is required to make each contact resulting in a decreased packing density of sensors.

SUMMARY OF THE INVENTION

A solid state image sensor is described which uses known silicon technology to accomplish random access, high sensitivity and non-destructive read-out. A single metallic contact on each cell is all that is required. In its basic form, light illuminates an isolated P-type diffusion in the epitaxial layer through a window in the metal line and polysilicon line. As explained in detail later, the floating P-diffusion is initially reverse-biased with respect to the surrounding N-epitaxy and the incoming light generates leakage current in the junction to thereby reduce the reverse bias in an amount dependent upon the intensity of the light and the duration for which it shines on the junction around the P-diffusion. The resistivity of the N-epi under the P-diffusion is dependent upon the width of the depletion layer and, accordingly, the resistivity is controlled as a function of the intensity of the incident light for a given duration or cycle time.

Accordingly, it is an object of this invention to provide a solid state imaging device using charge storage techniques that is easily manufactured utilizing well-known semiconductor techniques.

It is another object of this invention to provide a solid state imaging device which utilizes a technique for negatively charging a P-diffusion layer without physically contacting that region and which measures the discharge as the mode of read-out.

It is still another object of this invention to provide a solid state imaging device having only one metallic contact on each cell.

The invention will be better understood from the following description of the drawings.

BRIEF DESCRIPTION OF THE DRAWINGS

FIG. 7 is a cross-sectional view of a single cell of the solid state imaging device which is a preferred embodiment of this invention.

FIG. 8 is a schematic, partially cut-away view of an array of sensors.

DETAILED DESCRIPTION OF THE PREFERRED EMBODIMENT

Referring to FIGS. 1–6, a series of schematic views are shown to describe the basic construction of this invention. In FIGS. 1a and 1b, onto a P-silicon substrate 12, an N-type epitaxial layer 13 is deposited using conventional techniques such as by disproportionation or pyrolytic methods. In FIGS. 2a and 2b, and N+-type impurity is diffused into the epitaxy to form a plurality of bit lines 18. Areas defining discrete active areas in the epi-13 are formed by oxidizing sections of the epitaxy through to the substrate in a pattern shown in the top view, FIG. 3b. As seen in this figure the N+ bit lines, running parallel, connect columns of active areas with isolation between the active areas maintained by the $SiO_2$ barrier. In applications where increased cell sizes are acceptable, the $SiO_2$ isolation can easily be replaced with a P+-type material. Alternatively, region 16 may be a composite of $SiO_2$ and P+-type material where the $SiO_2$ extends only partially into the surface and the remaining portion of region 16 is P+-type material.

Figure 1A:
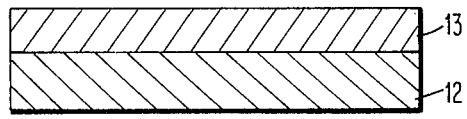
FIGS. 1A and B – 6A and B are schematics of the steps in making the invention.
Figure 1B:
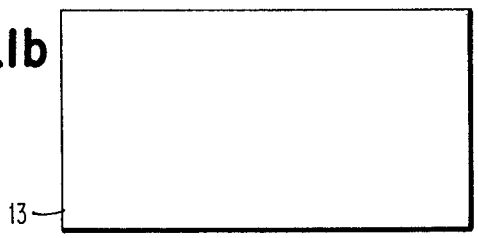
Figure 2A:
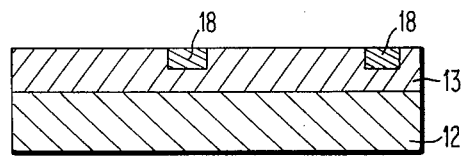
Figure 2B:
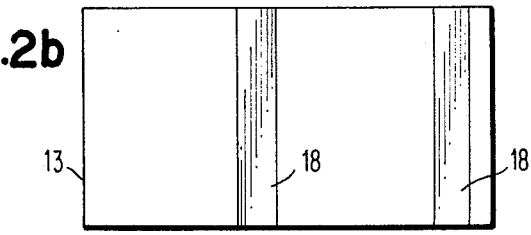
Figure 3A:
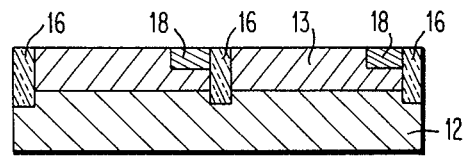
Figure 3B:
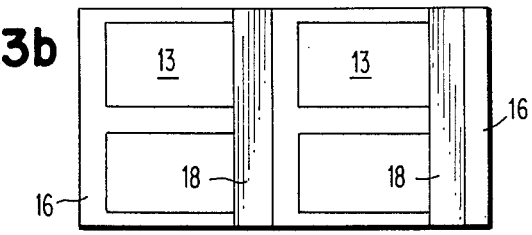
Figure 4A:
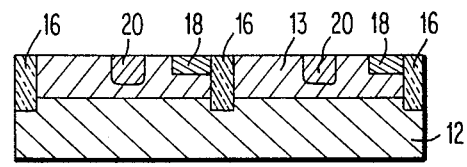
Figure 4B:
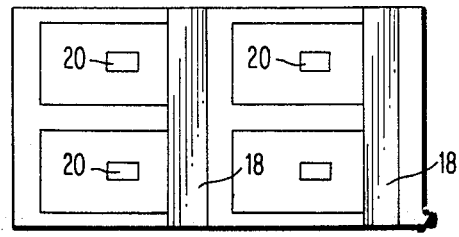
Figure 5A:
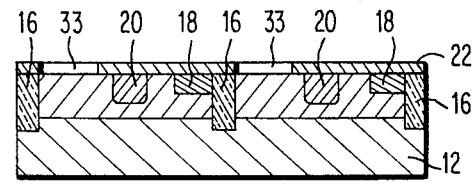
Figure 5B:
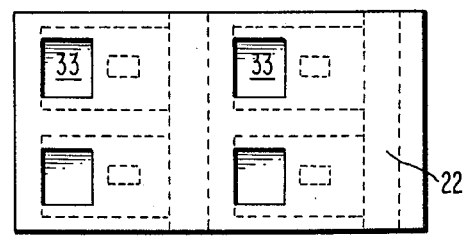

As shown in FIGS. 4a and 4b an isolated P-region 20 is then formed into the epi by diffusion of a P-type impurity. This diffusion will be used in the sensor as a floating gate, charged by a novel technique to be discussed herein. The top of the array is then covered, in the manner shown in FIGS. 5a and 5b, with a thin layer of $SiO_2$ 22. The area 33 of the epi-13, not coated with glass 22, is the point where a Schottky barrier diode will be formed by direct metal contact with the epi-13.

Figure 6A:
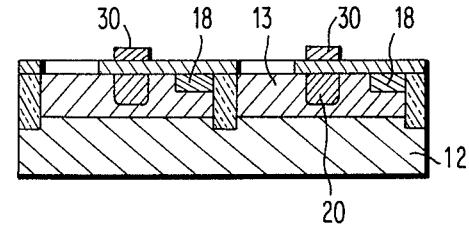
Figure 6B:
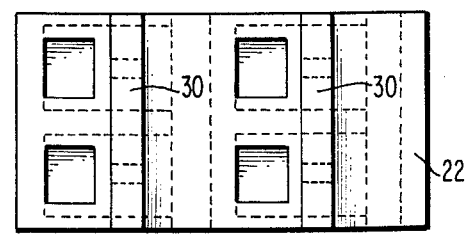

Gate electrodes 30, comprising a layer of polysilicon are then grown across the top of $SiO_2$ layer 22 and the polysilicon is heavily doped to become electrically conductive. As shown in FIGS. 6a and 6b, the polysilicon line is grown directly over the P-diffusion 20.

Referring now to FIG. 7 an isolated completed cell 10 is shown in cross-section. Typically, the array would be covered in all areas except at 33 with a thick layer of glass 23 to isolate the polysilicon line 30 from metal word lines 24. Glass 23 in conjunction with SiO$_2$ layer 22 serves to isolate metal lines 24 from the surface of the epitaxial layer 13. As shown in the cross-section in FIG. 7, this thick coating of glass 23, completely encompasses the gate electrode 30. Overlying the top of the cell is a strip of metal 24 which forms the word line of the sensor. This strip is provided with a window 26 directly over the gate electrode 30 to facilitate the propagation of light into the cell. A single point of contact 33 between the metal 24 and the epi-13 forms a Schottky barrier diode. This completed cell, as shown in FIG. 7, can be explained in terms of function as a J-FET having one electrode connected to the metal word line by means of a Schottky barrier contact.

FIG. 8 shows in a cut-away perspective a typical section of the matrix. In this figure, the thick layer of glass 23 which normally overlays the SiO$_2$ coating 22 and the gate electrodes 30 is cut-away.

In FIG. 8, six cells 10, forming a part of such an array of sensors are shown. In this figure, the elements have been separated and expanded for purposes of discussion. The packing density of the active elements is better shown in FIGS. 3a and 3b which clearly shows the inter-relationship between these elements in better proportion. As pictured, the N+ bit lines 18 and the gate electrodes or polysilicon lines 30 run in one direction with the metal word lines 24 crossing the array in an orthogonal direction.

In general, the device of FIG. 7 operates as follows. A fixed precharge is stored on the floating gate diffusion 20 and is discharged an amount dependent upon the intensity and duration of light passing through the window 26. The remaining stored charge represents a stored video signal, although the amount of charge is in fact inversely dependent upon the video intensity. This feature permits non-destructive read-out of the signal representing the video input. A forward voltage applied to the Schottky diode 33 via word line 24 and bit line 18 results in a current flow from the word line 24 to the n-epi 13 beneath the P-diffusion 20 and to bit line 18. The amount of current is controlled inversely by the charge stored on P-diffusion 20. Since the read-out does not destroy the charge on P-diffusion 20, the device provides non-destructive read-out.

In precharging the device, the substrate 12 is held at some suitable voltage, for example, −5 volts. The word line 24 and the bit line 18 are brought down to −5 volts for a brief time while the polysilicon line 30 is held at about 0 volts. The floating P-diffusion is thereby pulled down to about −4.3 volts. Both the word and bit lines are then brought back to 0 volts while the polysilicon line is brought down to approximately −5 volts.

The two lines going to zero tend to make the P-diffusion more positive while the negative going polysilicon line tends to make it more negative. The net result of this combination is that the P-diffusion is left floating at approximately −3 to −4 volts. The exact voltage is a function of the ratio of two capacitances. The first is the total capacitance between the P-diffusion and the word and bit lines and the second is the total capacitance between the P-diffusion and the polysilicon line. It is obviously better to have this ratio of capacitances as small as possible so that the reverse bias on the P-diffusion is large at the end of the line switching. It should be noted that by this technique a negative static charge is placed on the P-diffusion without any physical contact to that region.

As an alternative to applying a.c. signals to both the polysilicon line and the bit line, the floating P-diffusion may be precharged to a reverse biased condition by applying the a.c. signal to either line while the other is held at a fixed voltage (e.g., ground). This would simplify the peripheral driving circuits but at the expense of reducing the dynamic range of the cell because the floating junction would be precharged to a smaller negative voltage.

To read the signal, the metal word line 24 is raised to a voltage of approximately +1 volt so that the Schottky barrier diode, which is formed by the metal line's contact with the epitaxial layer, is forward biased and a d.c. current flow to the N+ bit line through the pinched section 32 of the epitaxy. The magnitude of the current depends on the charge on the P-diffusion which is an inverse function of the incident light. The flowing P-diffusion is not discharged by the read-out current, hence, the read-out is nondestructive. The sequence can be repeated by recharging the P-diffusion.

It is readily apparent from the drawings that the entire active area of the cell is shielded from unwanted light with the exception of gaps which may exist between the metal word lines. Such gaps can be blocked by any dark insulating material.

A matrix of sensor elements, such as shown in FIG. 8, can be employed as a substitute for a vidicon. High picture resolution is obtained because all the associated address and drive/sense circuits are located around the active cell area. With only cells such as those herein described and relegating the rest of the circuitry to the inactive region, high picture resolution is obtained.

A complementary circuit may also be made by substituting for the N-diffusions P-diffusions and vice versa, provided a good Schottky contact can be formed with the P-epi and the metal word lines. All voltage polarities must be changed accordingly.

While the invention has been described with respect to the preferred embodiment, it will be apparent that modification may be made thereto, without departing from the spirit and scope of the invention.

What is claimed is:

1. A method of using an image sensor be selective charging and readout, said sensor formed on a layer of semiconductor material of a first conductivity type having disposed thereon a layer of semiconductor material of a second conductivity type, an isolated region of said first conductivity type diffused into said second layer and extending to the surface thereof, a gate electrode transparent to incident radiation positioned above said isolated region and insulated from it, said sensor having a metal word line forming a Schottky barrier diode at a point of contact with said second layer and insulated from said gate electrode, said metal word line having an opening directly above said gate electrode to facilitate propagation of incident radiation through said gate electrode into said sensor, and a bit line diffused in said second layer spaced from said isolated region and insulated from said word line, comprising the steps of:

a. maintaining said layer of semiconductor material at a first voltage, b. applying a voltage to the word and bit lines of the sensor substantially equal to said first voltage while maintaining the gate electrode at a second voltage; and c. bringing the voltage of the word and bit lines to a third voltage while bringing the voltage of the gate electrode to the first voltage, whereby the isolated region is charged, without physical contact, at a floating voltage.

2. The method of claim 1 wherein the voltage of the isolated region is a function of the ratio of two capacitances, the first being the total capacitance between the isolated region and the work and bit lines and the second being the total capacitance between the isolated region and the gate electrode.

3. The method of claim 2 wherein the ratio of the two capacitances is reduced to increase the reverse bias on the isolated region.

4. The method of claim 1 wherein said substrate and said isolated region are of p-type conductivity, said epitaxial layer is of n-type conductivity and wherein said first voltage is negative with respect to said second and third voltages.

5. The method of claim 1 for reading the signal stored as a floating voltage in an image sensor, comprising:
   a. modifying said floating voltage by exposing said image sensor to light, wherein the modified voltage is representative of the intensity of and time of exposure to said light; and
   b. forward biasing said Schottky barrier diode to provide a current path between said word and bit lines via said second layer, the modified charge on said isolated diffused region controlling the resistance of said current path to cause the current on said bit line to be representative of the intensity of and time of exposure to said light.

6. An image sensor responsive to incident radiation comprising:
   a. a semiconductor wafer comprising a substrate of a first type conductivity having an upper layer of a second type conductivity deposited on one surface thereof;
   b. an isolated impurity region of said first type conductivity formed in said upper layer, said isolated impurity region extending to the surface of said upper layer;
   c. a bit line comprising an impurity region of said second type conductivity in said upper layer, said latter impurity region having a higher conductivity than the remaining portion of said upper layer;
   d. a gate electrode transparent to said incident radiation positioned directly above and electrically insulated from said isolated region; and
   e. a metal strip disposed across the top of said sensor electrically insulated from said gate electrode and said bit line and contacting said upper layer to form a Schottky diode, and metal strip having an opening at a location directly above said gate electrode to facilitate propagation of incident radiation through said gate electrode into said sensor.

7. The sensor of claim 6 wherein said first type conductivity is P-type and said second type conductivity is N-type, and said upper layer is an epitaxial layer.

8. The sensor of claim 6 wherein the gate electrode is a layer of polysilicon heavily doped to become electrically conductive, and said upper layer is an epitaxial layer.

9. An image sensor comprising:
   a substrate of a first type of material having an epitaxial layer of a second type of material deposited on one surface, a series of parallel bit lines diffused into said epitaxial layer and being an impurity of said second type of material, an impurity of the first type of material in the epitaxial layer in a regular pattern to form a series of isolated regions spaced from said bit lines, an oxidized blocking layer in said epitaxial layer defining areas of isolated regions and separating said bit lines, each bit line being continuous, and in common with said plurality of isolated regions, a series of gate electrodes disposed across the top of the substrate on parallel lines directly over said isolated regions and electrically insulated from them thereby forming an array of junction field effect transistor structures, a plurality of metal strips forming word lines of the sensor running across the array and contacting each junction field effect transistor structure at only one point on said epitaxial layer, said point of contact forming a Schottky barrier diode between the metal and said second type of material, each metal strip having a window at the point where it crosses each gate electrode, said bit lines being perpendicular to said word lines.

10. The image sensor of claim 9 wherein said first type of material is a N-type semiconductor and said second type of material is an P-type semiconductor.

11. The image sensor of claim 9 wherein said first type of material is a P-type semiconductor and said second type of material is an N-type semiconductor.

12. The image sensor of claim 10 wherein the gate electrodes are layers of polysilicon heavily doped to become conductive.

* * * * *